United States Patent
Haarburger et al.

(10) Patent No.: US 9,741,883 B2
(45) Date of Patent: Aug. 22, 2017

(54) FLOATING COVER SHEET ASSEMBLY HAVING A SOLAR MODULE

(71) Applicant: Benecke-Kaliko AG, Hannover (DE)

(72) Inventors: Tobias Haarburger, Celle (DE); Andreas Stoelting, Gehrden (DE)

(73) Assignee: Benecke-Kaliko AG, Hannover (DE)

( * ) Notice: Subject to any disclaimer, the term of this patent is extended or adjusted under 35 U.S.C. 154(b) by 243 days.

(21) Appl. No.: 14/301,998

(22) Filed: Jun. 11, 2014

(65) Prior Publication Data

US 2014/0290721 A1 Oct. 2, 2014

Related U.S. Application Data

(63) Continuation of application No. PCT/EP2012/072962, filed on Nov. 19, 2012.

(30) Foreign Application Priority Data

Dec. 12, 2011 (DE) .......................... 10 2011 056 284

(51) Int. Cl.
*H01L 31/044* (2014.01)
*H01L 31/042* (2014.01)
(Continued)

(52) U.S. Cl.
CPC .......... *H01L 31/0422* (2013.01); *B65D 88/34* (2013.01); *H01L 31/042* (2013.01);
(Continued)

(58) Field of Classification Search
CPC ........ H01L 31/00–31/078; Y02E 10/50–10/60
(Continued)

(56) References Cited

U.S. PATENT DOCUMENTS 4,235,221 A * 11/1980 Murphy .................... F03G 6/00
126/562
5,800,631 A * 9/1998 Yamada ................ H01L 31/048
136/251
(Continued)

FOREIGN PATENT DOCUMENTS

AU WO2011094803 * 8/2011
DE 39 19 125 A1 12/1990
(Continued)

OTHER PUBLICATIONS

International Search Report dated Feb. 15, 2013 of international application PCT/EP2012/072962 on which this application is based.

*Primary Examiner* — Bach Dinh
(74) *Attorney, Agent, or Firm* — Walter Ottesen, P.A.

(57) ABSTRACT

A floating cover sheet of a liquid reservoir is configured to rest on the liquid surface and includes a plurality of elongated sheet panels each defining edges and a lower region. The sheet panels are connected to one another and each of the sheet panels has a buoyant carrier sheet disposed in the lower region thereof. The buoyant carrier sheet is made of plastic and defines a carrier surface. A plurality of panel-shaped solar modules are applied to corresponding ones of the carrier surfaces of the carrier sheets. The solar module has a width less than the width of the corresponding sheet panel so as to define, on each sheet panel, a strip of carrier material free of the solar module corresponding thereto and configured to be walked on and to be slip resistant.

17 Claims, 1 Drawing Sheet

(51) Int. Cl.
*H02S 20/00* (2014.01)
*H01L 31/0445* (2014.01)
*B65D 88/34* (2006.01)
*E04H 4/10* (2006.01)

(52) U.S. Cl.
CPC .......... *H01L 31/0445* (2014.12); *H02S 20/00* (2013.01); *E04H 4/10* (2013.01); *Y02E 10/50* (2013.01)

(58) Field of Classification Search
USPC ................................................ 136/243–265
See application file for complete search history.

(56) References Cited

U.S. PATENT DOCUMENTS

| | | |
|---|---|---|
| 7,902,418 B2 | 3/2011 | Schmidt et al. |
| 2010/0294331 A1 | 11/2010 | Carnation |
| 2011/0168235 A1 | 7/2011 | Rosa Clot et al. |

FOREIGN PATENT DOCUMENTS

| | | |
|---|---|---|
| DE | 198 57 174 A1 | 6/2000 |
| DE | 199 08 645 A1 | 8/2000 |
| DE | 10 2009 008 067 A1 | 8/2010 |
| WO | 2009/045066 A2 | 4/2009 |

\* cited by examiner

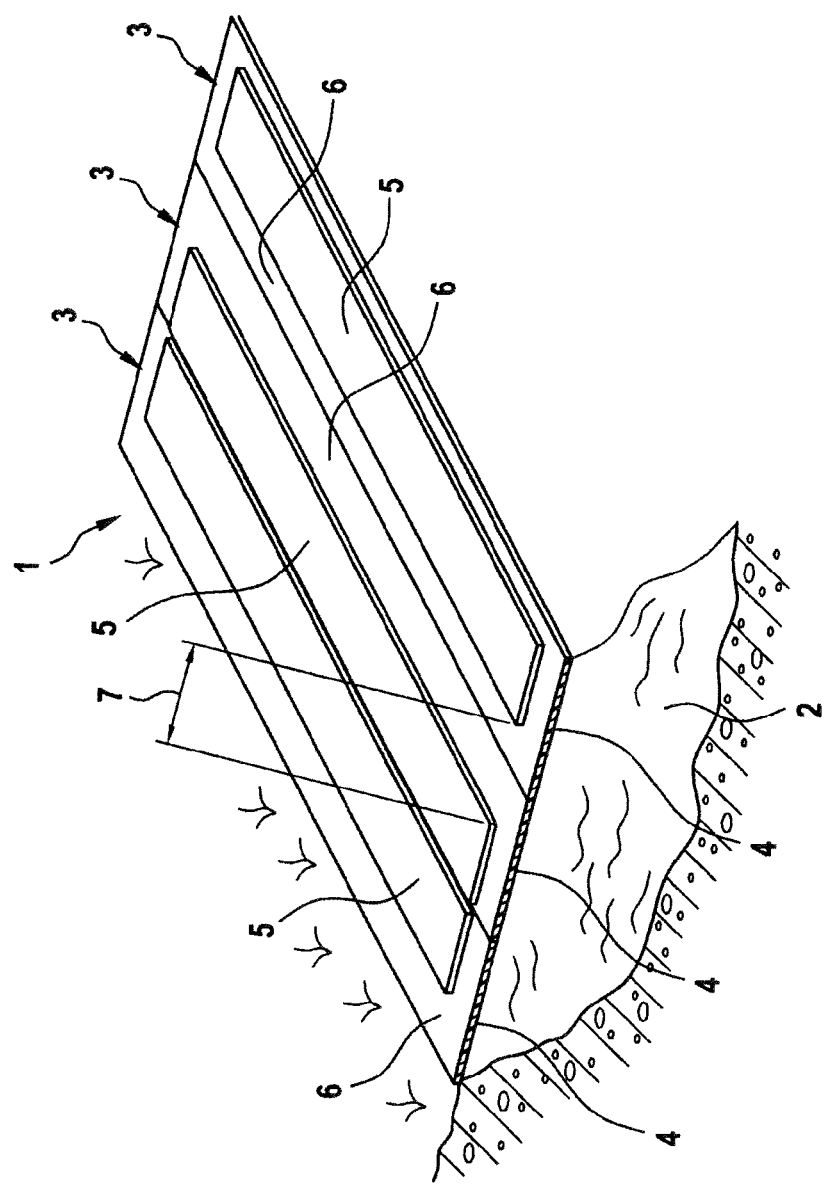

FLOATING COVER SHEET ASSEMBLY HAVING A SOLAR MODULE

CROSS REFERENCE TO RELATED APPLICATIONS

This application is a continuation application of international patent application PCT/EP2012/072962, filed Nov. 19, 2012, designating the United States and claiming priority from German application 10 2011 056 284.2, filed Dec. 12, 2011, and the entire content of both applications is incorporated herein by reference.

FIELD OF THE INVENTION

The invention relates to a floating cover sheet of a liquid reservoir, which lies on the surface of the liquid in the reservoir and is provided with a solar module, preferably a thin-film photovoltaic material.

BACKGROUND OF THE INVENTION

Photovoltaic systems in combination with covers over surfaces of water or photovoltaic systems immersed in water are known in the prior art.

Thus, U.S. Pat. No. 7,902,418 discloses a photovoltaic system which is integrated in water or adapted for use in a water environment and in which photovoltaic cells are attached to a sheet, known as a geomembrane. The geomembrane may in this case be arranged such that it is floating on the water or be suspended in the water, immersed to such an extent that the photovoltaic cells on the sheet are washed over by water, and consequently are cleaned and cooled. Various UV-resistant polymer coating materials as well as an inflatable geomembrane are disclosed.

United States patent application publication 2010/0294331 A1 discloses an arrangement of photovoltaic cells, embedded in a membrane or arranged on a membrane, which is placed as a cover over a water reservoir, that is, over the surface of a swimming pool or a pond, and which then serves for generating energy. The system as a whole floats on the water or else can be operated in an immersed state.

United States patent application publication 2011/0168235 discloses an arrangement of photovoltaic cells for generating electrical energy on a solid structure in sheet form (panel) immersed in water or floating on the water. The depth of immersion of the structure can be set as desired, from "floating" on the surface to "immersed" at a depth of for example two meters. The photovoltaic cells may be placed on flat or be formed in such a way that they are adjustable by means of linkages.

DE 198 57 174 A1 discloses a system of solar sheets floating in water, in which the sheet carrying the photovoltaic material is welded in between a lower bottom sheet and a transparent top sheet and in which intermediate spaces are provided between the sheets and can be filled on the one hand with air to regulate the depth of immersion and on the other hand with liquids, such as for instance alcohol, to achieve a lens effect.

DE 39 19 125 A1 discloses a low-density buoyant solar cell collector, the photovoltaic cells of which are embedded in a watertight manner in transparent plastic, with flushing holes arranged between the photovoltaic cells, intended for cleaning the surface or avoiding excessive water pressure in ocean swell.

DE 199 08 645 A1 discloses a floating solar collector with a thin-film photovoltaic material embedded in a watertight manner in a transparent sheet, the collector having loops or holes through which sticks of wood or bamboo that form the structure of the collector and provide the buoyancy can be pushed in.

The solutions known so far in the prior art of floating photovoltaic systems in the form of sheet laminates have the disadvantage that they cannot be walked on. Therefore, servicing and maintenance during operation are usually relatively difficult.

SUMMARY OF THE INVENTION

It is an object of the invention to provide a floating cover sheet for a water surface or for a liquid reservoir that is provided with a solar module and which cover sheet can also be walked upon, so that the cover sheet and the solar module can be serviced during operation without any problem. Preferably, the solar module is a thin-film photovoltaic material.

The floating cover sheet of the invention is configured for a liquid reservoir having delimiting walls and defining a liquid surface. The floating cover sheet is configured to rest on the liquid surface and includes: a plurality of elongated sheet panels each defining edges and a lower region; the plurality of elongated sheet panels being connected to one another at the edges; each of the elongated sheet panels having a buoyant carrier sheet disposed in the lower region thereof; the buoyant carrier sheet being made of plastic and defining a carrier surface disposed opposite to the liquid surface and facing outward; a plurality of elongated, panel-shaped solar modules applied to corresponding ones of the carrier surfaces of the carrier sheets; each of the solar modules defining a solar module width; each of the elongated sheet panels defining a sheet panel width; the solar module widths being less than respective ones of the sheet panel widths so as to define, on each sheet panel, a strip of carrier material free of the solar module corresponding thereto and configured to be walked on and to be slip resistant; and, the floating cover sheet at the edges thereof being fixedly connected to the delimiting walls.

The cover sheet of a liquid reservoir is made up of individual elongate sheet panels that are connected, preferably welded or adhesively bonded, to one another at the edges, each sheet panel having in the lower region a buoyant carrier sheet of plastic.

The surface of the carrier sheet that is opposite from the surface of the liquid and facing outward is covered by a solar module of an elongate form, preferably by a sheet laminate in the form of a panel, which comprises at least one layer of thin-film photovoltaic cells and has, on the outer side of the photovoltaic cells, one or more layers of transparent plastic. The solar modules may also be solar-thermal modules, which have inside them devices for passing through a cooling or heat-transfer fluid, for example tubular structures, capillaries or structures of open-cell plastic.

The width of the solar module or the sheet laminate is smaller in relation to the width of the sheet panel and is formed such that a strip of carrier material that is not covered by the solar module or sheet laminate, can be walked on and is slip resistant is formed on each sheet panel. In addition, the cover sheet is firmly connected at its edges to the delimiting walls of the liquid reservoir.

Such a form according to the invention can be produced on any sheet panel of a slip resistant strip, the bonding of the sheets to one another and the connection to the periphery of the reservoir having the effect inter alia, along with the buoyancy, of preventing sinking and providing a secure standing area on each strip.

An advantageous development is that the carrier sheet is provided with strengthening supports or reinforcing elements, for example is reinforced with woven fabrics of textiles, fibers, yarns or plastics, or else with what are known as cords of different materials. This also increases the load-bearing capacity of the carrier sheet, in particular with regard to slip resistance.

A further advantageous form is that the carrier sheet is made up of multiple layers and has at least one layer of expanded plastic, if appropriate a watertight-sealed or closed-cell expanded plastic. This increases the flotation or buoyancy of the sheet structure as a whole and, in particular, when there is a firm connection of the cover sheet at its edges to the delimiting walls of the liquid reservoir, leads to a slip resistance that takes a particularly stable form of the regions of each sheet that can be walked on.

A further advantageous form is that at least the parts of the sheet that come into contact with the surface of the liquid consist of plastics materials that are suitable for food contact applications, for example conforming to respective, valid versions of US Standard NSF/ANSI 61, for example NSF/ANSI 61-2010a, or other national or international food or water standards. This means that the cover sheet can easily be used for drinking water reservoirs.

A further advantageous form is that the photovoltaic cells are embedded in layers of plastic and are separated by the latter from the carrier sheet. This protects the thin-film photovoltaic cells that are usually used from being damaged and also provides a strain-tolerant, compliant mounting for sensitive structures of silicon or silver wafers.

In particular, a further advantageous form in this respect is that the at least one layer of plastic between the photovoltaic cells and the carrier sheet is of a stretchable form so as to compensate for tensile forces between the carrier sheet and the photovoltaic cells. This allows the carrier film that can be walked on even to be subjected to strong tensile forces/treading forces without these forces being transferred to the sensitive thin-film photovoltaic cells or their likewise embedded leads.

A further advantageous form is that the cover sheet is connected at its edges to the delimiting walls of the liquid reservoir while applying a tensile stress. Acting together with the "ballooning tension" produced by the flotation, this once again increases the load-bearing capacity and slip resistance of the carrier sheet, and consequently of the cover sheet as a whole.

A further advantageous form is that each two sheet panels lying next to one another are connected to one another in such a way that the strips of carrier material that can be walked on butt against one another, that is, are adhesively bonded or welded to one another after being rotated by 180° about their vertical axis, which extends perpendicularly in relation to the surface of the liquid. This leads to a widening of the "step area", and consequently makes it easier to make cover sheets of a greater surface area, for instance those with a covering area of over 2000 m², suitable for walking on.

BRIEF DESCRIPTION OF THE DRAWING

The invention will now be described with reference to the single FIGURE of the drawing (FIG. 1) which shows a cover sheet of a liquid reservoir.

DESCRIPTION OF THE PREFERRED EMBODIMENTS OF THE INVENTION

FIG. 1 shows a cover sheet 1 of a drinking water reservoir 2, which is made up of individual elongate sheet panels 3 that are connected to one another at the edges.

Each sheet panel has lying underneath a buoyant carrier sheet 4 of plastic.

The surface of the carrier sheet 4 that is opposite from the surface of the liquid and facing outward is covered by a sheet laminate 5 of an elongate form, in the form of a panel, which comprises a layer of thin-film photovoltaic cells, with multiple layers of transparent plastic on their outer side.

The width of the sheet laminate is smaller in relation to the width of the sheet panel and is formed such that a strip 6 of carrier material that is not covered by the sheet laminate, can be walked on and is slip resistant is formed on each sheet panel. Here, the width of the sheet laminate 5 corresponds approximately to half the width of a sheet panel.

The cover sheet is firmly connected at its edges to the delimiting walls of the liquid reservoir and, for reinforcement, has strengthening supports that are not shown any more specifically here.

Each two sheet panels lying next to one another are connected to one another after being turned by 180° about their vertical axis, which extends perpendicularly in relation to the surface of the liquid, such that the strips of carrier material that can be walked on butt against one another, and so a widened "tread strip", that is, a widened tread area 7, is produced.

It is understood that the foregoing description is that of the preferred embodiments of the invention and that various changes and modifications may be made thereto without departing from the spirit and scope of the invention as defined in the appended claims.

LIST OF DESIGNATIONS

Part of the Description

1 Cover sheet
2 Drinking water reservoir
3 Sheet panel
4 Carrier sheet
5 Sheet laminate with thin-film photovoltaic material
6 Slip resistant strip
7 Widened tread strip

What is claimed is:

1. A floating cover sheet assembly of a liquid reservoir having delimiting walls and defining a liquid surface, the floating cover sheet assembly being configured to rest on the liquid surface, the floating cover sheet assembly comprising:
   a plurality of elongated sheet panels defining mutually adjoining edges and respective lower regions;
   said plurality of elongated sheet panels being connected to one another at said mutually adjoining edges to provide a plurality of joining connections;
   each of said elongated sheet panels having a buoyant carrier sheet disposed in said lower region thereof;
   said buoyant carrier sheet being made of plastic and defining a carrier surface disposed opposite to the liquid surface and facing outward;
   a plurality of elongated, panel-shaped solar modules applied to corresponding ones of the carrier surfaces of said carrier sheets;
   each of said solar modules defining a solar module width;

each of said elongated sheet panels defining a sheet panel width and a sheet panel length;

said solar module widths being less than respective ones of said sheet panel widths and each one of said solar modules being arranged offset on the elongated sheet panel corresponding thereto so as to leave a strip of the carrier surface free thereon of the solar module corresponding thereto;

said elongated sheet panels being connected to one another at alternate ones of said joining connections so as to cause the strips of two mutually adjacent ones of said elongated sheet panels to conjointly define a widened tread strip to be walked upon and configured to be slip resistant at corresponding ones of said alternate ones of said joining connections;

at least one edge of at least one of the plurality of elongated sheet panels defining an outer edge of the floating cover sheet assembly;

and, said outer edge being, over the entire outer edge length thereof, in direct contact with and immovably connected to the delimiting walls of the liquid reservoir.

2. The floating cover sheet assembly of claim 1, wherein said carrier sheet includes at least one of strengthening members and reinforcing members.

3. The floating cover sheet assembly of claim 1, wherein each of said carrier sheets has multiple carrier layers including a carrier layer made of foamed plastic.

4. The floating cover sheet assembly of claim 3, wherein said carrier layer of foamed plastic is at least one of water-proof, sealed or closed pore foamed plastic.

5. The floating cover sheet assembly of claim 1, wherein:
said liquid reservoir is a water reservoir;
the floating cover sheet is configured for said water reservoir defining a water surface; and,
every part of the floating cover sheet which comes into contact with the water surface is made of a food safe plastic material.

6. The floating cover sheet assembly of claim 1, wherein:
said outer edge is configured to generate a tensile force as said outer edge is connected to said delimiting walls of the liquid reservoir; and,
said tensile force increases a load-bearing capacity of the floating cover sheet assembly.

7. A floating cover sheet assembly of a liquid reservoir having delimiting walls and defining a liquid surface, the floating cover sheet assembly being configured to rest on the liquid surface, the floating cover sheet assembly comprising:
a plurality of elongated sheet panels each defining mutually adjoining edges and respective lower regions;
said plurality of elongated sheet panels being connected to one another at said mutually adjoining edges to provide a plurality of joining connections;
each of said elongated sheet panels having a buoyant carrier sheet disposed in said lower region thereof;
said buoyant carrier sheet being made of plastic and defining a carrier surface disposed opposite to the liquid surface and facing outward;
a plurality of elongated, band-shaped sheet laminates applied to corresponding ones of the carrier surfaces of said carrier sheets;
each of said elongated band-shaped sheet laminates including at least one layer of thin-film photovoltaic cells defining an outer side;
said band-shaped sheet laminates each further including at least one layer of light-permeable plastic disposed on said outer side;

each of said sheet laminates defining a sheet laminate width;

each of said sheet panels defining a sheet panel width and a sheet panel length;

each of said sheet laminates widths being less than respective ones of said elongated sheet panel widths and each one of said sheet laminates being arranged offset on the elongated sheet panel corresponding thereto so as to leave a strip of the carrier surface free thereon of the sheet laminate corresponding thereto;

said elongated sheet panels being connected to one another at alternate ones of said joining connections so as to cause the strips of two mutually adjacent ones of said elongated sheet panels to conjointly define a widened tread strip to be walked upon and configured to be slip resistant at corresponding ones of said alternate ones of said joining connections;

at least one edge of at least one of the plurality of elongated sheet panels defining an outer edge of the floating cover sheet assembly; and, said outer edge being, over the entire outer edge length thereof, in direct contact with and immovably connected to the delimiting walls of the liquid reservoir.

8. The floating cover sheet assembly of claim 7, wherein said carrier sheet includes at least one of strengthening members and reinforcing members.

9. The floating cover sheet assembly of claim 7, wherein each of said carrier sheets has multiple carrier layers including a carrier layer made of foamed plastic.

10. The floating cover sheet assembly of claim 9, wherein said carrier layer of foamed plastic is at least one of water-proof, sealed or closed pore foamed plastic.

11. The floating cover sheet assembly of claim 7, wherein:
said liquid reservoir is a water reservoir;
the floating cover sheet is configured for said water reservoir defining a water surface; and,
every part of the floating cover sheet assembly which comes into contact with the water surface is made of a food safe plastic material.

12. The floating cover sheet assembly of claim 7 further comprising:
at least two plastic layers; and,
said photovoltaic cells being embedded in said plastic layers and separated from said carrier sheet by at least one of said plastic layers.

13. The floating cover sheet assembly of claim 12, wherein said at least one plastic layer separating said photovoltaic cells and said carrier sheet is configured elastically so as to cause tensile forces between said carrier sheet and said photovoltaic cells to be compensated.

14. The floating cover sheet assembly of claim 7, wherein:
said outer edge is configured to generate a tensile force as said outer edge is connected to said delimiting walls of the liquid reservoir; and,
said tensile force increases a load-bearing capacity of the floating cover sheet.

15. The floating cover sheet assembly of claim 1, wherein each of the plurality of elongated, panel-shaped solar modules is arranged flat on said corresponding ones of said carrier surfaces.

16. The floating cover sheet assembly of claim 7, wherein said elongated band-shaped sheet laminates including said at least one layer of thin-film photovoltaic cells are arranged flat on said corresponding ones of said carrier surfaces.

17. A floating cover sheet assembly of a liquid reservoir having delimiting walls and defining a liquid surface, the floating cover sheet assembly being configured to rest on the liquid surface, the floating cover sheet assembly comprising:
- a plurality of elongated sheet panels defining mutually adjoining edges and respective lower regions;
- said plurality of elongated sheet panels being connected to one another at said mutually adjoining edges to provide a plurality of joining connections;
- each of said elongated sheet panels having a buoyant carrier sheet disposed in said lower region thereof;
- said buoyant carrier sheet being made of plastic and defining a carrier surface disposed opposite to the liquid surface and facing outward;
- a plurality of elongated, panel-shaped solar modules applied to corresponding ones of the carrier surfaces of said carrier sheets;
- each of said solar modules defining a solar module width;
- each of said elongated sheet panels defining a sheet panel width and a sheet panel length;
  - said solar module widths being less than respective ones of said sheet panel widths and each one of said solar modules being arranged offset on the elongated sheet panel corresponding thereto so as to leave a strip of the carrier surface free thereon of the solar module corresponding thereto; and,
  - said elongated sheet panels being connected to one another at alternate ones of said joining connections so as to cause the strips of two mutually adjacent ones of said elongated sheet panels to conjointly define a widened tread strip to be walked upon and configured to be slip resistant at corresponding ones of said alternate ones of said joining connections.

* * * * *